United States Patent
Wang

(10) Patent No.: US 8,766,304 B2
(45) Date of Patent: Jul. 1, 2014

(54) PACKAGE STRUCTURE OF SEMICONDUCTOR LIGHT EMITTING ELEMENT

(75) Inventor: Chi-Kuon Wang, Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/616,637

(22) Filed: Sep. 14, 2012

(65) Prior Publication Data

US 2013/0069094 A1   Mar. 21, 2013

(30) Foreign Application Priority Data

Sep. 15, 2011   (TW) .............................. 100133238 A

(51) Int. Cl.
*H01L 33/00* (2010.01)

(52) U.S. Cl.
USPC .......................................................... 257/98

(58) Field of Classification Search
USPC .................. 257/E33.067, E33.066, E33.062, 257/E23.141, 98, 99, 100, 91, 95
See application file for complete search history.

(56) References Cited

U.S. PATENT DOCUMENTS

| 7,141,884 B2 | 11/2006 | Kojima et al. | |
|---|---|---|---|
| 7,837,343 B2 | 11/2010 | Shibasaki et al. | |
| 7,851,819 B2 * | 12/2010 | Shi | 257/99 |
| 2005/0001331 A1 * | 1/2005 | Kojima et al. | 257/778 |
| 2007/0295969 A1 | 12/2007 | Chew et al. | |
| 2011/0101399 A1 * | 5/2011 | Suehiro et al. | 257/98 |

FOREIGN PATENT DOCUMENTS

| CN | 1577736 A | 2/2005 |
|---|---|---|
| EP | 1732144 A2 | 12/2006 |
| TW | 200618333 | 6/2006 |
| TW | 200817790 | 4/2008 |
| TW | 200929470 | 7/2009 |
| TW | M391722 | 11/2010 |

OTHER PUBLICATIONS

EP Search Report dated Oct. 8, 2013.
TW Office Action dated Nov. 22, 2013.
English Abstract translation of TWM391722 (Published Nov. 1, 2010).

* cited by examiner

*Primary Examiner* — Matthew Reames
*Assistant Examiner* — Nicholas J Choi
(74) *Attorney, Agent, or Firm* — McClure, Qualey & Rodack, LLP

(57) ABSTRACT

A package structure of semiconductor light emitting element is provided. The package structure of semiconductor light emitting element includes a substrate, a light emitting element and a transparent conductive board. A first electrode and a second electrode are disposed on the substrate. The light emitting element is disposed on the substrate and between the first electrode and the second electrode. A first bonding pad and a second bonding pad are disposed on the light emitting element. The transparent conductive board has a first surface and a second surface opposite to the first surface. The second surface of the transparent conductive board is located over the light emitting element for electrically connecting the first electrode and the first bonding pad and electrically connecting the second electrode and the second bonding pad.

9 Claims, 2 Drawing Sheets

PACKAGE STRUCTURE OF SEMICONDUCTOR LIGHT EMITTING ELEMENT

This application claims the benefit of Taiwan application Serial No. 100133238, filed Sep. 15, 2011, the subject matter of which is incorporated herein by reference.

BACKGROUND OF THE INVENTION

1. Field of the Invention

The invention relates in general to an element packaging structure, and more particularly to a package structure of semiconductor light emitting element.

2. Description of the Related Art

The light emitting diode (LED) emits a light by converting electricity into photo energy. The light emitting diode is mainly formed by a semiconductor. The light emitting diode, having the features of long lifespan, low temperature and high utilization rate of energy, has been widely used in various lamps and has gradually replaced conventional light sources.

Conventional surface mount technology (SMT) light emitting diode is electrically connected to an external wire substrate through at least a metal wire, such that the semiconductor layer inside the light emitting diode is electrified by the current transmitted through the metal wire to illuminate. The metal wire is commonly formed by gold which has high ductility. The metal wire is not permeable to the light and is very expensive. Considering the cost and optical transmittance, the diameter of the metal wire cannot be too large otherwise the overall light output might be affected. Also, if the differences between the coefficient of thermal expansion (CTE) of the metal wire and those of the light emitting diode and the substrate are too large, the metal wire soldered between the light emitting diode and the substrate by a wire-bonding machine may be pulled and break or the solder ball at the end of the metal wire may come off. Particularly, during the temperature cycling test, the thermal stress may affect the structural strength of the metal wire and may even cause the metal wire to break or come off and end up with an increase in product failure rate.

SUMMARY OF THE INVENTION

The invention is directed to a package structure of semiconductor light emitting element, which enhances structural strength and increases optical transmittance through an electrical bonding structure provided by a transparent conductive board.

According to an embodiment of the present invention, a package structure of semiconductor light emitting element is provided. The package structure of semiconductor light emitting element includes a substrate, a light emitting element and a transparent conductive board. A first electrode and a second electrode are disposed on the substrate. The light emitting element is disposed on the substrate and between the first electrode and the second electrode. A first bonding pad and a second bonding pad are disposed on the light emitting element. The transparent conductive board has a first surface and a second surface opposite to the first surface. The second surface of the transparent conductive board is located over the light emitting element for electrically connecting the first electrode and the first bonding pad and electrically connecting the second electrode and the second bonding pad.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the package structure of semiconductor light emitting element of the embodiments, the bonding pad of the light emitting element is electrically connected to the electrode of the substrate through an electrical bonding structure provided by a transparent conductive board. The base material of the transparent conductive board is glass or plastics. Several metal compound film patterns are formed on the surface of the transparent conductive board for transmitting the current to the bonding pad of the light emitting element. The metal compound film pattern is transparent and conductive, and does not affect the light output of the light emitting element.

A number of embodiments are disclosed below for elaborating the invention. However, the embodiments of the invention are for detailed descriptions only, not for limiting the scope of protection of the invention.

First Embodiment

Figure 1:
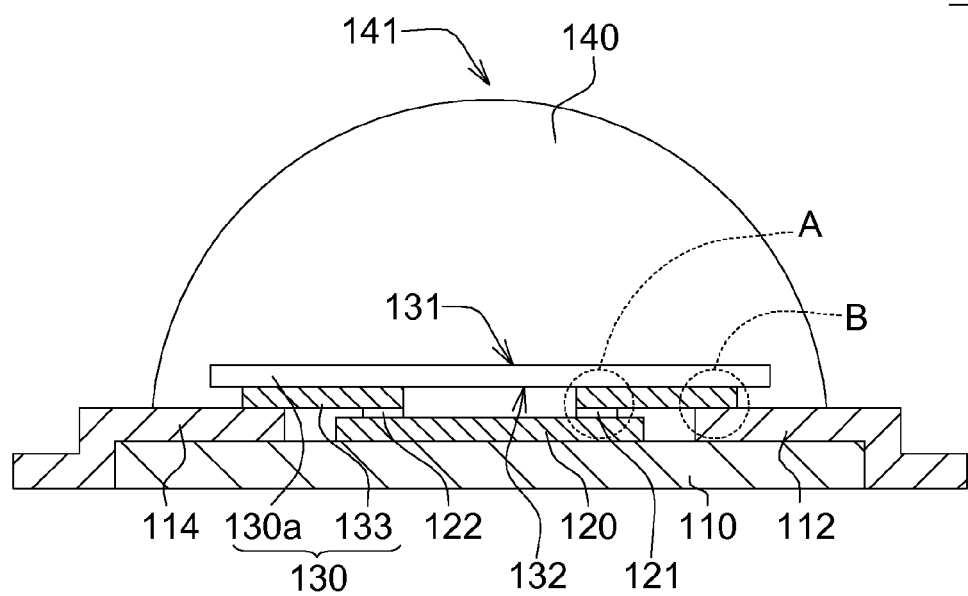
FIG. 1 shows a cross-sectional view of a package structure of semiconductor light emitting element according to an embodiment of the invention.

Referring to FIG. 1, a cross-sectional view of a package structure of semiconductor light emitting element according to an embodiment of the invention is shown. The package structure 100 of semiconductor light emitting element includes a substrate 110, a light emitting element 120 and a transparent conductive board 130. A first electrode 112 and a second electrode 114 are disposed on the substrate 110. The light emitting element 120 is disposed on the substrate 110 and between the first electrode 112 and the second electrode 114. A first bonding pad 121 and a second bonding pad 122 are disposed on the light emitting element 120. The transparent conductive board 130 has a first surface 131 and a second surface 132 opposite to the first surface 131, wherein the first surface 131 is planar. The second surface 132 of the transparent conductive board 130 is located over the light emitting element 120 for electrically connecting the first electrode 112 and the first bonding pad 121 and electrically connecting the second electrode 114 and the second bonding pad 122.

In the present embodiment, the transparent conductive board 130 has a transparent plate 130a with a predetermined thickness which may be changed for changing the hardness or flexibility of the transparent conductive board 130 to fit actual needs. In addition, the second surface 132 of the transparent plate 130a is opposite to the top surface of the light emitting element 120, and two metal compound films 133 are formed on the second surface 132. The metal compound films 133 are transparent and conductive substance having the features of optical transparency and conductivity, and may be used to replace the generally known metal wire.

In an embodiment, the metal compound films 133 may be formed by a transparent and conductive material selected from metal oxides, metal nitrides, metal fluorides or a combination thereof. For example, the metal compound films 133 are formed by a material selected from indium tin oxide (ITO), aluminum zinc oxide (AZO), indium zinc oxide (IZO), zinc gallium oxide (GZO), fluorine tin oxide (FTO, SnO2:F), titanium nitride, titanium tantalum nitride (TiO2:Ta) or a combination thereof. The metal compound films 133 possessing the feature of optical transparency are coated on a transparent base by way of chemical or physical vapor deposition without affecting the light output of the light emitting element 120. The metal compound films 133 may form a predetermined number of circuit patterns (such as two) by way of dry etching or wet etching, wherein one circuit is electrically connected between the first electrode 112 and the first bonding pad 121 and the other circuit is electrically connected between the second electrode 114 and the second bonding pad 122.

Referring to the internal bonding region A and the external bonding region B as illustrated in FIG. 1. The transparent conductive board 130 may be bonded to the first bonding pad 121, the first electrode 112, the second bonding pad 122 and the second electrode 114 through a conductive adhesive (not illustrated) to enhance the bonding strength of the bonding regions A and B. In addition, the transparent conductive board 130 is bonded to the first bonding pad 121, the first electrode 112, the second bonding pad 122 and the second electrode 114 by using laser soldering, and the same effect can also be achieved. As the bonding regions A and B bonded together by using laser soldering receive the energy of light wave, parts of two regions melt when heated and the metals therein are soldered together to enhance the bonding strength.

The package structure 100 of FIG. 1 may further include a package colloid 140 covering the transparent conductive board 130, a part of the first electrode 112 and a part of the second electrode 114. The package colloid 140 is a transparent colloid formed by polymer resin. The package colloid 140 has a convex surface 141 which functions like a convex lens, and a part of the first electrode 112 and a part of the second electrode 114 are extended outside the package colloid 140 for electrically connecting an external power. In the present embodiment, the first electrode 112 is extended to a lateral side of the substrate 110 from the top surface of the substrate 110, and the second electrode 114 is extended to an opposite lateral side of the substrate 110 from the top surface of the substrate 110. The first electrode 112 and the second electrode 114 may respectively be realized by a negative polarity and a positive polarity, and a voltage difference is generated between the first electrode 112 and the second electrode 114 such that the current provided by the external power may flow through the light emitting element 120 to be converted into a photo energy. In the present embodiment, the light emitting element 120 is an electroluminescent light emitting diode. The bottom surface of the light emitting element 120 is disposed on the substrate 110 and the heat generated by the light emitting element 120 may be dissipated through the substrate 110 for increasing the luminous efficiency of the light emitting element 120.

To summarize, the light emitting diode includes a first-type semiconductor layer, an active layer and a second-type semiconductor layer which are formed in order. The active layer may include a multi-quantum well layer. The first-type semiconductor layer may be realized by a nitride semiconductor layer containing N-type impurities. The second-type semiconductor layer may be realized by a nitride semiconductor layer containing P-type impurities. The first-type semiconductor layer and the second-type semiconductor layer may be realized by an N-type semiconductor layer and a P-type semiconductor layer which have opposite polarities, and may be formed by a nitride of the IIIA group of the periodic table, such as gallium nitride, aluminum gallium nitride, indium gallium nitride or nitride of aluminum indium gallium. The first bonding pad 121 disposed on the first-type semiconductor layer (N-type semiconductor layer) is electronegative and is electrically connected to the first electrode 112, which is also electronegative, through the transparent conductive board 130. The second bonding pad 122 disposed on the second-type semiconductor layer (P-type semiconductor layer) is electropositive and is electrically connected to the second electrode 114, which is also electropositive, through the transparent conductive layer 130. Therefore, a required driving voltage is provided to the light emitting element 120 for emitting the light.

Second Embodiment

Figure 2:
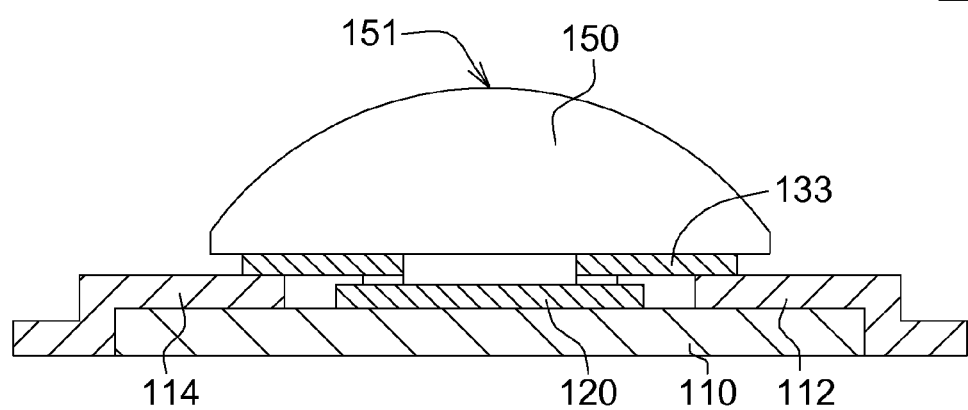
FIG. 2 shows a cross-sectional view of a package structure of semiconductor light emitting element according to another embodiment of the invention.

Referring to FIG. 2, a cross-sectional view of a package structure of semiconductor light emitting element according to another embodiment of the invention is shown. In the first embodiment indicated in FIG. 1, the transparent conductive board 130 is a thin plate and the first surface 131 is planar. In the embodiment indicated in FIG. 2, the first surface 151 of the transparent conductive board 150 is protruded from the peripheral towards the center to form a shape similar to a convex lens and capable of concentrating the light like a convex lens. However, the shape of the transparent conductive board 150 is not limited to the above exemplification. For example, the first surface 151 may be biconvex and indented at the center. The present embodiment may achieve special optical effect by changing the shape and optical properties of the transparent conductive board 150 such that the optical path of the light is changed accordingly.

Third Embodiment

Figure 3A:
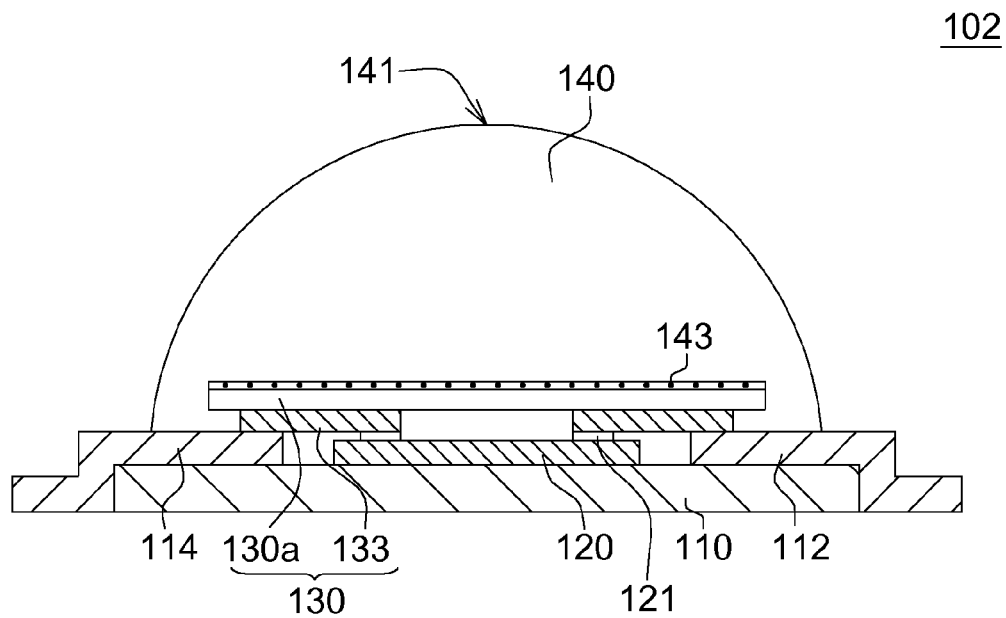
FIGS. 3A and 3B respectively are cross-sectional views of a package structure of semiconductor light emitting element according to an alternate embodiment of the invention.

Referring to FIG. 3A, a cross-sectional views of a package structure of semiconductor light emitting element according to an alternate embodiment of the invention is shown. According to the first embodiment, the package structure 102 of semiconductor light emitting element of the third embodiment may further include a fluorescent material 143 formed on the first surface 131 of the transparent conductive board 130 by way of coating or deposition. The fluorescent material 143 may also be doped in the transparent conductive board 130.

In the present embodiment, the selection of fluorescent material 143 is based on the luminescent spectrum of the light emitting element 120 such that the required color light is generated. For example, the blue light emitted by the blue light emitting diode is selected to excite the YAG yellow fluorescent powder to generate a white light which is further emitted through the package colloid 140.

Fourth Embodiment

Figure 3B:
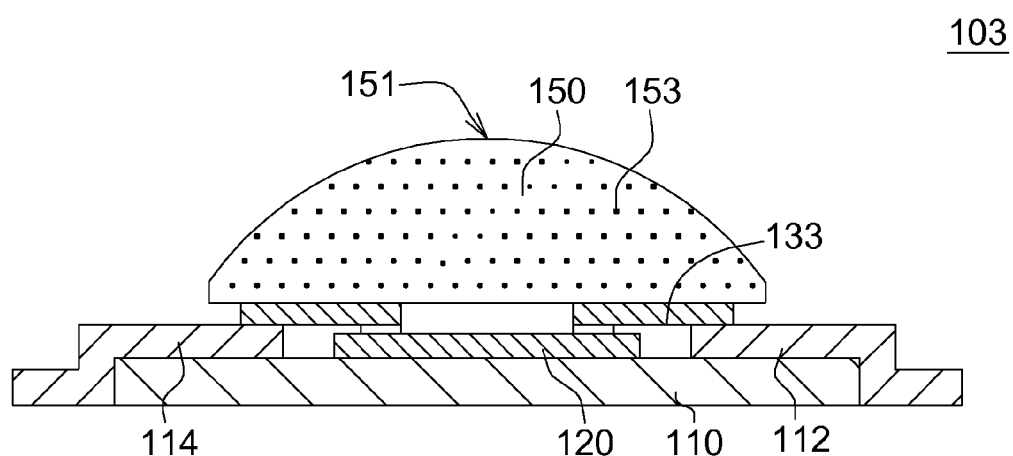

Referring to FIG. 3B, a cross-sectional views of a package structure of semiconductor light emitting element according to another alternate embodiment of the invention. According to the second embodiment, the package structure 103 of semiconductor light emitting element of the fourth embodiment may further include a fluorescent material 153 directly doped in a transparent conductive board 150 whose shape is like a convex lens. Similarly, in the present embodiment, the selection of fluorescent material 153 is based on the luminescent spectrum of the light emitting element 120 such that the required color light is generated.

The package structure of the invention may also be used for a plurality of light emitting elements, that is, a multi-chip package structure. The structure and principles of each light emitting element are similar to that disclosed in the above embodiments, and the similarities are note repeated. Each light emitting element in conjunction with required fluorescent powder(s) may achieve the desired mixed color. The light emitting element may go with a single fluorescent powder or a mixture of different fluorescent powders. The invention is not limited thereto.

According to the package structure of semiconductor light emitting element disclosed in above embodiments of the invention, the bonding pad of the light emitting element is electrically connected to the electrode of the substrate through an electrical bonding structure provided by a transparent conductive board. The transparent conductive board not only increases the structural strength, but also possesses transparency and conductivity without affecting the light output of the light emitting element.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure of light emitting diode, comprising:
 a substrate on which a first electrode and a second electrode are disposed, the first electrode is extended to a lateral side of the substrate from a top surface of the substrate, and the second electrode is extended to an opposite lateral side of the substrate from the top surface of the substrate;
 a light emitting diode disposed on the top surface of the substrate and between the first electrode and the second electrode, wherein a first bonding pad and a second bonding pad are disposed on the light emitting diode;
 a transparent conductive board having a non-conductive transparent plate and two conductive films, the transparent plate has a first surface and a second surface opposite to the first surface, wherein the second surface of the transparent plate is located above the light emitting diode, one of the two conductive films is extended along the second surface from a first bonding region on the first bonding pad outward to a second bonding region on the first electrode for electrically connecting the first electrode and the first bonding pad and the other of the two conductive films is extended along the second surface from a third bonding region on the second bonding pad outward to a fourth bonding region on the second electrode for electrically connecting the second electrode and the second bonding pad; and
 a package colloid covering the transparent conductive board, a part of the first electrode and a part of the second electrode.

2. The package structure of light emitting diode according to claim 1, wherein the transparent plate is formed by glass or plastics, and the two conductive films are metal compound films formed on the second surface.

3. The package structure of light emitting diode according to claim 1, wherein the first surface of the transparent plate is planar.

4. The package structure of light emitting diode according to claim 1, further comprising a fluorescent material formed on the first surface of the transparent plate or doped in the transparent plate.

5. The package structure of light emitting diode according to claim 1, wherein the transparent conductive board is bonded to the first bonding pad, the first electrode, the second bonding pad and the second electrode by a conductive adhesive.

6. The package structure of light emitting diode according to claim 1, wherein the transparent conductive board is bonded to the first bonding pad, the first electrode, the second bonding pad and the second electrode by using laser soldering.

7. The package structure of light emitting diode according to claim 1, wherein the first electrode is extended to a lateral side of the substrate from a top surface of the substrate, and the second electrode is extended to an opposite lateral side of the substrate from the top surface of the substrate.

8. The package structure of light emitting diode according to claim 2, wherein the metal compound film is formed by at least a material selected from a group formed by metal oxides, metal nitrides and metal fluorides.

9. The package structure of light emitting diode according to claim 8, wherein the metal compound film is formed by at least a material selected from a group formed by indium tin oxide (ITO), aluminum zinc oxide (AZO), indium zinc oxide (IZO), zinc gallium oxide (GZO), fluorine tin oxide (FTO, $SnO_2$: F), titanium nitride, and titanium tantalum nitride ($TiO_2$: Ta).

* * * * *